United States Patent
Jung et al.

(10) Patent No.: US 8,815,127 B2
(45) Date of Patent: Aug. 26, 2014

(54) PASTE COMPOSITION FOR SOLAR CELL ELECTRODE, ELECTRODE FABRICATED USING THE SAME, AND SOLAR CELL INCLUDING THE SAME

(75) Inventors: Seok Hyun Jung, Uiwang-si (KR); Jung Chul Lee, Uiwang-si (KR); Hyun Joo Jung, Uiwang-si (KR); Jae Ho Kim, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 0 days.

(21) Appl. No.: 13/592,799

(22) Filed: Aug. 23, 2012

(65) Prior Publication Data

US 2013/0140500 A1  Jun. 6, 2013

(30) Foreign Application Priority Data

Dec. 2, 2011 (KR) .................. 10-2011-0128663

(51) Int. Cl.
  *H01B 1/16* (2006.01)
  *H01B 1/22* (2006.01)
  *H01L 31/0224* (2006.01)

(52) U.S. Cl.
  USPC .......................... 252/514; 136/252

(58) Field of Classification Search
  CPC .... H01B 1/16; H01B 1/22; H01L 31/022425; H01H 1/023; C03C 4/14; C03C 14/006; C03C 2214/00; C09D 5/24
  USPC ............ 252/512–514; 136/252–256
  See application file for complete search history.

(56) References Cited

U.S. PATENT DOCUMENTS

| | | | | |
|---|---|---|---|---|
| 6,071,437 A * | 6/2000 | Oya | ................ | 252/514 |
| 7,459,201 B2 * | 12/2008 | Yamaguchi | ................ | 428/209 |
| 7,828,994 B2 * | 11/2010 | Don et al. | ................ | 252/514 |
| 8,029,701 B2 * | 10/2011 | Kuwajima | ................ | 252/512 |
| 8,039,734 B2 * | 10/2011 | Kwag et al. | ................ | 136/255 |
| 8,332,996 B2 * | 12/2012 | Kim et al. | ................ | 29/25.42 |
| 2013/0319496 A1 * | 12/2013 | Karpowich et al. | ................ | 136/244 |

FOREIGN PATENT DOCUMENTS

| | | |
|---|---|---|
| EP | 0-466-344 A1 | 1/1992 |
| EP | 1-400-987 A2 | 3/2004 |
| KR | 10-2001-0111214 A | 12/2001 |
| WO | WO2010/135950 | * 12/2010 |

OTHER PUBLICATIONS

Office Action mailed Dec. 20, 2013 in corresponding German Patent Application No. 10-2012-111-648.2.
Office Action mailed Dec. 18, 2013 in corresponding Korean Patent Application No. 10-2011-0128663.

* cited by examiner

*Primary Examiner* — Mark Kopec
(74) *Attorney, Agent, or Firm* — Lee & Morse, P.C.

(57) ABSTRACT

A paste composition for a solar cell electrode includes: a mixture of conductive powders, a glass frit, and an organic vehicle, and the mixture of conductive powders includes about 1 wt % to about 10 wt % of a first conductive powder having an average particle diameter (Dx) from about 1 nm to about 100 nm, and about 90 wt % to about 99 wt % of a second conductive powder having an average particle diameter (D50) from about 0.5 μm to about 5 μm.

19 Claims, 1 Drawing Sheet

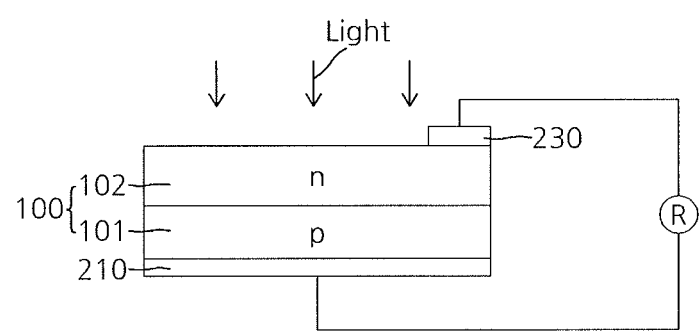

PASTE COMPOSITION FOR SOLAR CELL ELECTRODE, ELECTRODE FABRICATED USING THE SAME, AND SOLAR CELL INCLUDING THE SAME

CROSS-REFERENCE TO RELATED APPLICATION

This application claims priority under 35 U.S.C. §119 to Korean Patent Application No. 10-2011-0128663 filed on Dec. 2, 2011, in the Korean Intellectual Property Office, and entitled: "Paste Composition for Solar Cell Electrode, Electrode Fabricated Using the Same, and Solar Cell Including the Same," is incorporated by reference herein in its entirety.

BACKGROUND

1. Field

Embodiments relate to a paste composition for a solar cell electrode, an electrode fabricated using the same, and a solar cell including the same.

2. Description of the Related Art

As fossil fuels such as oil and coal may run out, solar cells utilizing sunlight as an alternative energy source may attract attention. Solar cells may generate electric energy using the photovoltaic effect of a p-n junction which converts photons of sunlight into electricity.

SUMMARY

Embodiments are directed to a paste composition for a solar cell electrode, including a mixture of conductive powders, a glass fit, and an organic vehicle, wherein the mixture of conductive powders may include about 1 wt % to about 10 wt % of a first conductive powder having an average particle diameter (Dx) from about 1 nm to about 100 nm, and about 90 wt % to about 99 wt % of a second conductive powder having an average particle diameter (D50) from about 0.5 μm to about 5 μm.

The mixture of conductive powders may include about 4 wt % to about 9.9 wt % of the first conductive powder.

The mixture of conductive powders may include about 90.1 wt % to about 96 wt % of the second conductive powder.

The average particle diameter (Dx) of the first conductive powder may be from about 20 nm to about 60 nm.

The average particle diameter (D50) of the second conductive powder may be from about 1.5 μm to about 2.5 μm.

The first conductive powder may have a specific surface area from about 3.0 m$^2$/g to about 30.0 m$^2$/g.

The specific surface area of the first conductive powder may be from about 5.0 m$^2$/g to about 25.0 m$^2$/g.

The second conductive powder may have a specific surface area from about 0.1 m$^2$/g to about 2.0 m$^2$/g.

The specific surface area of the second conductive powder may be from about 0.1 m$^2$/g to about 0.5 m$^2$/g.

The first conductive powder and the second conductive powder both may be spherical conductive powders.

The mixture of conductive powders may include at least one selected from the group of silver (Ag), gold (Au), palladium (Pd), platinum (Pt), copper (Cu), chromium (Cr), cobalt (Co), aluminum (Al), tin (Sn), lead (Pb), zinc (Zn), iron (Fe), iridium (Ir), osmium (Os), rhodium (Rh), tungsten (W), molybdenum (Mo), nickel (Ni), and indium tin oxide (ITO) powders.

A material of the first conductive powder and a material of the second conductive powder may be the same.

The glass frit may have an average particle diameter (D50) ranging from about 0.1 μm to about 20 μm.

The glass frit may have a softening point of about 300° C. to about 700° C.

The paste composition may include about 60 wt % to about 90 wt % of the mixture of conductive powders, about 1 wt % to about 10 wt % of the glass fit, and about 5 wt % to about 30 wt % of the organic vehicle.

The paste composition may further include at least one additive selected from the group of a dispersant, a thixotropic agent, a plasticizer, a viscosity stabilizer, an anti-foaming agent, a pigment, a UV stabilizer, an antioxidant, and a coupling agent.

The paste composition may have a viscosity from about 100 Pa·s to about 500 Pa·s.

Embodiments are also directed to an electrode formed of the paste composition.

Embodiments are also directed to a solar cell including the electrode.

BRIEF DESCRIPTION OF THE DRAWING

Features will become apparent to those of skill in the art by describing in detail exemplary embodiments with reference to the attached drawing in which:

FIG. 1 illustrates a schematic view of a solar cell manufactured using a paste in accordance with an embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figure, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, or one or more intervening layers may also be present. In addition, it will also be understood that when a layer is referred to as being "between" two layers, it can be the only layer between the two layers, or one or more intervening layers may also be present.

A paste composition for solar cell electrodes may include a mixture of conductive powders, a glass frit, and an organic vehicle, wherein the mixture of conductive powders may include about 1 wt % to about 10 wt % of a first conductive powder having an average particle diameter (Dx) from about 1 nm to about 100 nm, and about 90 wt % to about 99 wt % of a second conductive powder having an average particle diameter (D50) from about 0.5 μm to about 5 μm.

Mixture of Conductive Powders

The paste composition may include a mixture of a first conductive powder having an average particle diameter (Dx) of about 1 to about 100 nm and a second conductive powder having an average particle diameter (D50) of about 0.5 to about 5 μm.

By way of example, the average particle diameter (Dx) of the first conductive powder may be measured by measuring the particle diameters of 200 or more particles using a transmission electron microscope (TEM) at a magnification of 174,000 times using an image analysis program (Azo-kun for Windows, version 2.20, Asahi Kasei Engineering, Japan) after dispersing 0.1 g of the first conductive powder, 0.1 g of oleic acid, and 5.0 g of cyclohexane at 25° C. for 2 minutes via ultrasonication.

By way of example, the average particle diameter (D50) of the second conductive powder may be measured using a Model 1064D (CILAS Co., Ltd.) after dispersing the conductive powder in isopropyl alcohol (IPA) at 25° C. for 3 minutes via ultrasonication.

The first conductive powder may be present in an amount of about 1 wt % to 10 wt % in the mixture of conductive powders. Preferably, the first conductive powder may be present in an amount of about 1 wt % to less than 10 wt % in the mixture of conductive powders. Within this range, processibility and short circuit current or fill factor may be improved. The first conductive powder is preferably present in an amount of about 1 wt % to about 9.9 wt %, more preferably about 4 wt % to about 9.9 wt % in the mixture of conductive powders.

The first conductive powder preferably has an average particle diameter (Dx) from about 10 nm to about 80 nm, more preferably from about 20 nm to about 60 nm.

The first conductive powder may have a specific surface area from about 3.0 m$^2$/g to about 30.0 m$^2$/g. Within this range, processibility and short circuit current or fill factor may be improved. Preferably, the first conductive powder has a specific surface area from about 5 m$^2$/g to about 25.0 m$^2$/g.

The first conductive powder may be present in an amount of about 1 wt % to about 10 wt %, preferably about 1 wt % to about 8 wt %, more preferably about 4 wt % to about 8 wt %, based on a total wt % of the paste composition. The first conductive powder may be a spherical conductive powder.

The second conductive powder may be present in an amount of about 90 wt % to about 99 wt % in the mixture of conductive powders. Preferably, the second conductive powder may be present in an amount of about greater than 90 wt % to 99 wt % or less in the mixture of conductive powders. Within this range, printing properties and short circuit current or fill factor may be improved. The second conductive powder is preferably present in an amount of about 90.1 wt % to about 99 wt %, more preferably about 90.1 wt % to about 96 wt % in the mixture of conductive powders.

The second conductive powder preferably has an average particle diameter (D50) of about 0.5 μm to about 3 μm, more preferably about 0.8 μm to about 2.5 μM, and still more preferably about 1.5 μm to about 2.5 μm.

The second conductive powder may have a specific surface area from about 0.1 m$^2$/g to about 2.0 m$^2$/g. Within this range, processibility and short circuit current or fill factor may be improved. Preferably, the second conductive powder has a specific surface area from about 0.1 m$^2$/g to about 0.5 m$^2$/g.

The second conductive powder may be present in an amount of about 71 wt % to about 80 wt %, preferably about 73 wt % to about 80 wt %, more preferably about 73 wt % to about 77 wt %, based on a total wt % of the paste composition. The second conductive powder may be a spherical conductive powder.

The weight ratio of the first conductive powder to the second conductive powder may range from about 0.01 to about 0.15, preferably from about 0.01 to about 0.11, more preferably from about 0.05 to about 0.11. Within this range, conversion efficiency of the solar cell may be improved. Preferably, both the first conductive powder and the second conductive powder are spherical conductive powders.

The mixture of conductive powders may further include at least one kind of conductive powder having an average particle diameter outside the ranges described above.

The mixture of conductive powders may be present in an amount of about 60 wt % to about 90 wt % in the paste composition. Within this range, deterioration in conversion efficiency due to an increase of resistance may be substantially prevented, and difficulty in forming the paste due to a relative reduction in the amount of the organic vehicle may be substantially prevented. The conductive powder is preferably present in an amount of about 70 to about 90 wt % in the paste composition.

As for the type of the conductive powders, a suitable conductive powder type may be used, e.g., organic conductive powders and/or inorganic conductive powders. For example, the conductive powders may include at least one kind of metal powder selected from the group of silver (Ag), gold (Au), palladium (Pd), platinum (Pt), copper (Cu), chromium (Cr), cobalt (Co), aluminum (Al), tin (Sn), lead (Pb), zinc (Zn), iron (Fe), iridium (Ir), osmium (Os), rhodium (Rh), tungsten (W), molybdenum (Mo), nickel (Ni), and indium tin oxide (ITO) powder. These powders may be used alone or as a mixture of two or more thereof.

The first conductive powder and the second conductive powder may be the same or different types of conductive powders. Preferably, both the first and second conductive powders are silver powders.

The conductive powders may have a spherical shape, a flake shape, an amorphous shape, or a combination thereof. In an embodiment, the conductive powders may have a spherical shape, and thus fill factor and sintering density may be improved.

Glass Frit

The glass frit may enhance adhesion of the conductive powder with respect to the wafer, and may generate crystals of the conductive powder in an emitter region by etching an anti-reflection layer and melting the conductive powder so as to improve contact resistance during a burning process of the paste.

The glass frit may comprise a suitable type of glass frit, e.g., crystallized glass frit or non-crystallized glass frit. The glass frit may be, e.g., a leaded glass frit, a lead-free glass frit, and mixtures thereof.

For example, the glass frit may include at least one selected from the group of zinc oxide-silicon oxide ($ZnO$—$SiO_2$), zinc oxide-boron oxide-silicon oxide ($ZnO$—$B_2O_3$—$SiO_2$), zinc oxide-boron oxide-silicon oxide-aluminum oxide ($ZnO$—$B_2O_3$—$SiO_2$—$Al_2O_3$), bismuth oxide-silicon oxide ($Bi_2O_3$—$SiO_2$), bismuth oxide-boron oxide-silicon oxide ($Bi_2O_3$—$B_2O_3$—$SiO_2$), bismuth oxide-boron oxide-silicon oxide-aluminum oxide ($Bi_2O_3$—$B_2O_3$—$SiO_2$—$Al_2O_3$), bismuth oxide-zinc oxide-boron oxide-silicon oxide ($Bi_2O_3$—$ZnO$—$B_2O_3$—$SiO_2$), and bismuth oxide-zinc oxide-boron oxide-silicon oxide-aluminum oxide ($Bi_2O_3$—$ZnO$—$B_2O_3$—$SiO_2$—$Al_2O_3$) glass frit.

The glass frit may have an average particle diameter (D50) ranging from about 0.1 μm to about 20 μm, preferably from about 0.5 μm to about 10 μm. Within this range, dispersion of the glass frit and printability may be improved. The average particle diameter may be measured by a Model 1064D (CILAS Co., Ltd.) after dispersing the glass fit in isopropyl alcohol (IPA) at room temperature for 3 minutes via ultrasonication.

The glass frit may have a softening point of about 300° C. to about 700° C., and preferably about 300° C. to about 600° C.

The glass fit may be present in an amount of about 1 wt % to about 10 wt % in the paste composition. Within this range, sintering properties and adhesion of the conductive powder may be improved, and deterioration in conversion efficiency due to resistance increase may be substantially prevented. Further, an excessive amount of glass frit may be substantially prevented from remaining after a burning process (an excessive amount of glass frit may cause increased resistance and deterioration of wettability). Preferably, the glass fit may be present in an amount of about 1 wt % to about 7 wt %.

Organic Vehicle

The organic vehicle may include an organic binder which may provide liquid properties to the paste.

The organic binder may be a suitable organic binder. Examples of the organic binder may include cellulose polymers, such as ethyl cellulose, hydroxyethyl cellulose, hydroxypropyl cellulose, hydroxyethyl hydroxypropyl cellulose, and the like; acrylic polymers obtained by copolymerization with hydrophilic acrylic monomers such as carboxyl groups; and polyvinyl resins. These binders may be may be used alone or as a mixture of two or more thereof.

The organic vehicle may further include a solvent. The organic vehicle may be a solution prepared by dissolving the organic binder in the solvent. The organic vehicle may include about 1 wt % to about 80 wt % of the organic binder and about 20 wt % to about 99 wt % of the solvent.

The solvent may be selected from the group of Carbitol solvents, aliphatic alcohols, ester solvents, Cellosolve solvents and hydrocarbon solvents. Examples of solvents suitable for use in the paste composition may include butyl Carbitol, butyl Carbitol acetate, methyl Cellosolve, ethyl Cellosolve, butyl Cellosolve, aliphatic alcohols, terpineol, ethylene glycol, ethylene glycol monobutyl ether, butyl Cellosolve acetate, Texanol, and mixtures thereof.

The organic vehicle may be present in an amount of about 5 wt % to about 30 wt % in the paste composition. Within this range, inefficient dispersion or excessive increase in viscosity after preparation of the paste (which can lead to printing difficulty) may be substantially prevented, and an increase in resistance and other problems that can occur during the burning process may also be substantially prevented. Preferably, the organic vehicle may be present in an amount of about 8 wt % to about 20 wt %.

The paste composition may further include additives which may enhance flow properties, process properties, stability, and the like. The additives may be suitable additives, e.g., a dispersant, a thixotropic agent, a plasticizer, a viscosity stabilizer, an anti-foaming agent, a pigment, a UV stabilizer, an antioxidant, a coupling agent, or mixtures thereof. These additives may be present in an amount of about 0.1 wt % to about 5 wt % in the paste composition.

The paste composition may have a viscosity from about 100 Pa's to about 500 Pa·s, which is measured at 10 rpm and 23° C. using a Brookfield viscometer (DV-II+PRO viscometer, Brookfield Co., Ltd.). Within this range, the paste composition may have improved printability.

According to an embodiment an electrode may be formed using the paste composition described above, and a solar cell may include the electrode.

Solar cell electrodes may be fabricated by a suitable method. For example, a preliminary process for preparing a rear electrode may be performed by printing the paste composition on a rear surface of a wafer and drying the printed paste at about 200 to about 400° C. for about 10 to about 60 seconds. Further, a preliminary process for preparing a front electrode may be performed by printing the paste composition on a front surface of the wafer and drying the printed paste. Then, front and rear electrodes may be formed by burning the wafer at about 400 to about 900° C. for about 30 to 50 seconds.

FIG. 1 illustrates a solar cell in accordance with an embodiment.

Referring to FIG. 1, a rear electrode 210 and a front electrode 230 may be formed by printing and burning the paste on a wafer or substrate 100 that includes a p-layer 101 and an n-layer 102, which serves as an emitter. The solar cell may be a suitable type of solar cell, and may be different from the type of solar cell illustrated in FIG. 1.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Specifications of components used in the following examples and comparative examples are as follows:

(A) Conductive Powder:

(a1) Spherical Ag powder having an average particle diameter (D50) of 2.0 μm (AG-4-8, specific surface area: 0.43 m$^2$/g, Dowa HighTech Co., Ltd.), (a2) Spherical Ag powder having an average particle diameter (Dx) of 20 nm (TW-A01, specific surface area 17 m$^2$/g, Dowa Hightech Co., Ltd.), (a3) Spherical Ag powder having an average particle diameter (Dx) of 60 nm (TW-A02, specific surface area: 7 m$^2$/g, Dowa HighTech Co., Ltd.), and (a4) Spherical Ag powder having an average particle diameter (Dx) of 300 nm (TW-A03, specific surface area: 1.2 m$^2$/g, Dowa HighTech Co., Ltd.).

(B) Glass frit:

(b1) Leaded glass frit having an average particle diameter (D50) of 1.0 μm and a softening point of 451° C. (Leaded Glass, CI-1090, Particlogy Co., Ltd.), and (b2) Leaded glass frit having an average particle diameter (D50) of 1.0 μm and a softening point of 430° C. (Leaded Glass, CI-5008, Particlogy Co., Ltd.)

(C) Organic vehicle:

(c1) Ethyl cellulose (STD4, Dow Chemical Co., Ltd.), and (c2) butyl Carbitol (D) Additives:

(d1) BYK102 as a dispersing agent (BYK Chemie), and (d2) Thixatrol ST as a thixotropic agent (Elementis Co., Ltd.)

Example 1

1 part by weight of ethyl cellulose was dissolved in 12.5 parts by weight of butyl Carbitol at 60° C. Then, the resultant was mixed with the conductive powder, the glass fit, and the additives at a ratio given in Table 1 (unit:parts by weight), followed by kneading using a 3-roll kneader, thereby preparing paste compositions for a solar cell electrode.

Examples 2 to 4 and Comparative Examples 1 to 4

The same process as in Example 1 was carried to prepare paste compositions for a solar cell electrode, except that the conductive powder had compositions as shown in Table 1.

TABLE 1

|     |      | Example 1 | Example 2 | Example 3 | Example 4 | Comparative Example 1 | Comparative Example 2 | Comparative Example 3 | Comparative Example 4 |
|-----|------|-----------|-----------|-----------|-----------|-----------------------|-----------------------|-----------------------|-----------------------|
| (A) | (a1) | 80        | 77        | 73        | 80        | 81                    | 70                    | 80.5                  | 80                    |
|     | (a2) | —         | —         | —         | 1         | —                     | —                     | —                     | —                     |
|     | (a3) | 1         | 4         | 8         | —         | —                     | 11                    | 0.5                   | —                     |
|     | (a4) | —         | —         | —         | —         | —                     | —                     | —                     | 1                     |
| (B) | (b1) | 4         | 4         | 4         | 4         | 4                     | 4                     | 4                     | 4                     |
|     | (b2) | 1         | 1         | 1         | 1         | 1                     | 1                     | 1                     | 1                     |
| (C) | (c1) | 1         | 1         | 1         | 1         | 1                     | 1                     | 1                     | 1                     |
|     | (c2) | 12.5      | 12.5      | 12.5      | 12.5      | 12.5                  | 12.5                  | 12.5                  | 12.5                  |
| (D) | (d1) | 0.2       | 0.2       | 0.2       | 0.2       | 0.2                   | 0.2                   | 0.2                   | 0.2                   |
|     | (d2) | 0.3       | 0.3       | 0.3       | 0.3       | 0.3                   | 0.3                   | 0.3                   | 0.3                   |
| Total |    | 100       | 100       | 100       | 100       | 100                   | 100                   | 100                   | 100                   |

The properties of the paste compositions prepared in the Examples and Comparative Examples were evaluated, and results are shown in Table 2.

(1) Viscosity: Viscosity of each prepared paste composition was measured at 1, 2, 5, 10, 20, 50, 100, 120, and 200 rpm at 23° C. using a Brookfield viscometer (DV-II+PRO viscometer, Brookfield Co., Ltd.), and the viscosity at 10 rpm was selected.

(2) Viscosity ratio: (viscosity at 1 rpm)/(viscosity at 10 rpm) was obtained as the viscosity ratio.

(3) Pattern aspect ratio: The paste was printed on a front side of a wafer in a predetermined pattern by screen printing, followed by drying in an IR oven. Then, an aluminum paste was printed over a rear side of the wafer, followed by drying in the same way. The prepared cell was subjected to burning in a belt type furnace at a temperature zone of about 300 to about 750° C. for 60 seconds. For the cell, the thickness and line width of the burnt front pattern were measured using a 3D laser microscope (VK-9700K, KEYENCE Co., Ltd.) to obtain an aspect ratio (thickness/line width).

(4) Short-circuit current (Isc, A), fill factor (FF, %), conversion efficiency (Efts., %): With respect to the cell prepared, short-circuit current, fill factor, and conversion efficiency were measured using a solar cell efficiency tester (CT-180, Pasan Co., Ltd.).

trodes. The electrodes of the solar cell may be formed on the wafer by applying, patterning, and burning a paste composition for electrodes.

In solar cells, quality may be improved by improving conversion efficiency (i.e., efficiency of converting sunlight energy to electric current). Conversion efficiency of the solar cell may be increased by adjusting the size, surface treatment or a mixing ratio of conductive powders of the paste composition for the electrodes. Also, sintering density or electrode resistance may be improved by mixing conductive powders having different particle sizes. However, if nanoparticles are used, this may result in low processibility due to rapid increase in viscosity of the paste resulting from an increase in specific surface area.

In this regard, embodiments are directed to improvements in both conversion efficiency for a paste composition for a solar cell as well as improvements in processibility through adjustment of the viscosity of the paste; i.e., embodiment of the paste composition described above may achieve improved conversion efficiency and processibility. In particular, the paste composition may achieve a fine pattern to improve short circuit current and processibility, and may provide a high fill factor through improvement of serial resistance of the electrode, thereby improving conversion efficiency of a solar cell.

TABLE 2

|                      | Example 1 | Example 2 | Example 3 | Example 4 | Comparative Example 1 | Comparative Example 2 | Comparative Example 3 | Comparative Example 4 |
|----------------------|-----------|-----------|-----------|-----------|-----------------------|-----------------------|-----------------------|-----------------------|
| Viscosity (Pa·s)     | 305       | 387       | 452       | 377       | 242                   | 516                   | 280                   | 264                   |
| Viscosity ratio      | 6.1       | 6.3       | 6.4       | 6.2       | 5.6                   | 6.1                   | 6.1                   | 5.7                   |
| Pattern aspect ratio | 0.26      | 0.31      | 0.31      | 0.28      | 0.18                  | 0.15                  | 0.25                  | 0.18                  |
| Isc(A)               | 5.69      | 5.71      | 5.71      | 5.70      | 5.46                  | 5.14                  | 5.69                  | 5.49                  |
| FF(%)                | 77.1      | 77.8      | 77.7      | 77.5      | 75.7                  | 61.2                  | 75.8                  | 76.1                  |
| Eff.(%)              | 17.7      | 17.9      | 17.9      | 17.8      | 16.7                  | 12.7                  | 17.4                  | 16.9                  |

As shown in Table 2, the paste composition according to the Examples 1-4 realized an improved pattern shape, and thus short-circuit current, fill factors, and conversion efficiency of the solar cell were improved.

By way of summary and review, in a solar cell, a front electrode and a rear electrode may be formed respectively on front and rear surfaces of a semiconductor wafer or substrate with the p-n junction. Then, a photovoltaic effect of the p-n junction may be induced by sunlight entering the wafer and electrons generated by the photovoltaic effect of the p-n junction may provide an electric current flowing through the elec- Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A paste composition for a solar cell electrode, comprising:

a mixture of conductive powders;
a glass fit; and
an organic vehicle;
   wherein the mixture of conductive powders comprises about 1 wt % to about 10 wt % of a first silver-containing conductive powder having an average particle diameter (Dx) from about 1 nm to about 100 nm, and about 90 wt % to about 99 wt % of a second silver-containing conductive powder having an average particle diameter (D50) from about 0.5 μm to about 5 μm.

2. The paste composition as claimed in claim 1, wherein the mixture of conductive powders comprises about 4 wt % to about 9.9 wt % of the first conductive powder.

3. The paste composition as claimed in claim 1, wherein the mixture of conductive powders comprises about 90.1 wt % to about 96 wt % of the second conductive powder.

4. The paste composition as claimed in claim 1, wherein the average particle diameter (Dx) of the first conductive powder is from about 20 nm to about 60 nm.

5. The paste composition as claimed in claim 1, wherein the average particle diameter (D50) of the second conductive powder is from about 1.5 μm to about 2.5 μm.

6. The paste composition as claimed in claim 1, wherein the first conductive powder has a specific surface area from about 3.0 m$^2$/g to about 30.0 m$^2$/g.

7. The paste composition as claimed in claim 6, wherein the specific surface area of the first conductive powder is from about 5.0 m$^2$/g to about 25.0 m$^2$/g.

8. The paste composition as claimed in claim 1, wherein the second conductive powder has a specific surface area from about 0.1 m$^2$/g to about 2.0 m$^2$/g.

9. The paste composition as claimed in claim 8, wherein the specific surface area of the second conductive powder is from about 0.1 m$^2$/g to about 0.5 m$^2$/g.

10. The paste composition as claimed in claim 1, wherein the first conductive powder and the second conductive powder are both spherical conductive powders.

11. The paste composition as claimed in claim 1, wherein the mixture of conductive powders further comprises at least one selected from the group of gold (Au), palladium (Pd), platinum (Pt), copper (Cu), chromium (Cr), cobalt (Co), aluminum (Al), tin (Sn), lead (Pb), zinc (Zn), iron (Fe), iridium (Ir), osmium (Os), rhodium (Rh), tungsten (W), molybdenum (Mo), nickel (Ni), and indium tin oxide (ITO) powders.

12. The paste composition as claimed in claim 1, wherein a material of the first conductive powder and a material of the second conductive powder are the same.

13. The paste composition as claimed in claim 1, wherein the glass frit has an average particle diameter (D50) ranging from about 0.1 μm to about 20 μm.

14. The paste composition as claimed in claim 1, wherein the glass frit has a softening point of about 300° C. to about 700° C.

15. The paste composition as claimed in claim 1, wherein the paste composition comprises: about 60 wt % to about 90 wt % of the mixture of conductive powders, about 1 wt % to about 10 wt % of the glass frit, and about 5 wt % to about 30 wt % of the organic vehicle.

16. The paste composition as claimed in claim 1, further comprising: at least one additive selected from the group of a dispersant, a thixotropic agent, a plasticizer, a viscosity stabilizer, an anti-foaming agent, a pigment, a UV stabilizer, an antioxidant, and a coupling agent.

17. The paste composition as claimed in claim 1, wherein the paste composition has a viscosity from about 100 Pa·s to about 500 Pa·s.

18. An electrode formed of the paste composition as claimed in claim 1.

19. A solar cell comprising the electrode as claimed in claim 18.

* * * * *